United States Patent [19]

Kitakado et al.

[11] Patent Number: 5,161,202
[45] Date of Patent: Nov. 3, 1992

[54] METHOD OF AND DEVICE FOR INSPECTING PATTERN OF PRINTED CIRCUIT BOARD

[75] Inventors: Ryuji Kitakado; Hironobu Yano; Tetsuo Hoki, all of Kyoto, Japan

[73] Assignee: Dainippon Screen Mfg. Co. Ltd., Japan

[21] Appl. No.: 731,851

[22] Filed: Jul. 16, 1991

[30] Foreign Application Priority Data

Jul. 18, 1990 [JP] Japan .................................. 2-191343

[51] Int. Cl.$^5$ .............................................. G06K 9/00
[52] U.S. Cl. ........................................ 382/8; 358/107
[58] Field of Search ...................... 382/8, 26; 358/106, 358/107; 356/237, 394; 364/489, 490, 491, 468

[56] References Cited

U.S. PATENT DOCUMENTS

| | | | |
|---|---|---|---|
| 4,866,629 | 9/1989 | Chen et al. | 382/8 |
| 4,908,871 | 3/1990 | Hara et al. | 382/8 |
| 5,018,211 | 5/1991 | Jaffe et al. | 382/8 |
| 5,027,417 | 6/1991 | Kitakado et al. | 382/8 |

Primary Examiner—Leo H. Boudreau
Attorney, Agent, or Firm—Ostrolenk, Faber, Gerb & Soffen

[57] ABSTRACT

Respective images of a conductive pattern and through holes of a printed circuit board are obtained. The through holes are classified into normal through holes having a relatively large diameter and mini via holes having a comparatively small diameter. The mini via hole image is enlarged to become an enlarged mini via hole image (SHSm). The image of the conductive pattern has hole parts therein, which are filled with images generated from the normal through hole image and the mini via hole image to obtain a corrected pattern image (CPS). The edge of the corrected pattern image is detected and enlarged to obtain an enlarged edge image (SES). The enlarged edge image is classified into two areas, one of which overlaps with the enlarged mini via hole image (SHSm). These two areas are subjected to inspection in different inspection modes.

26 Claims, 16 Drawing Sheets

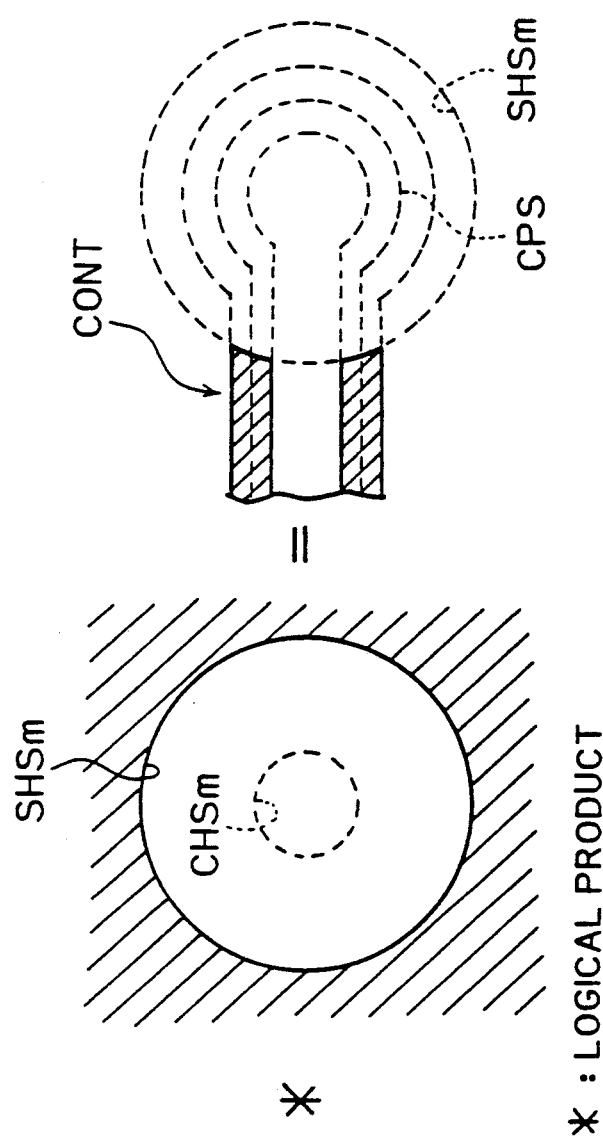
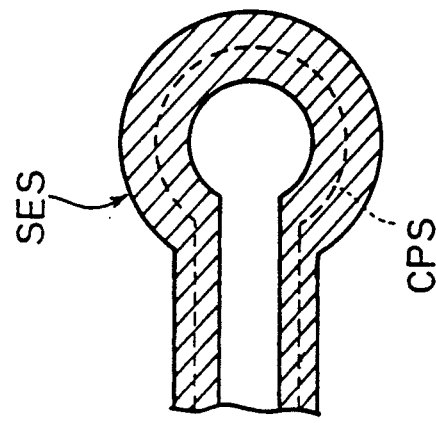
FIG. 6E-3    FIG. 6E-2    FIG. 6E-1
*: LOGICAL PRODUCT

METHOD OF AND DEVICE FOR INSPECTING PATTERN OF PRINTED CIRCUIT BOARD

BACKGROUND OF THE INVENTION

1. Field of the Invention

The present invention relates to a method of and a device for inspecting a pattern of a printed circuit board, and more particularly to a technique for omitting unnecessary inspections or simplifying inspections of items of small significance to improve the inspection efficiency.

2. Description of the Background Art

Printed circuit boards are employed for mounting and interconnecting electronic elements, and are provided with conductive wiring patterns on one or both sides of insulating boards and with a large number of through holes piercing the insulating boards. Various types of optical visual inspection devices or pattern inspection devices have been employed in order to inspect whether or not the conductive pattern and the through holes are formed accurately to meet a predefined tolerance.

A pattern inspection device is disclosed, for example, in Japanese Patent Laid-Open Gazette No. 63-15374 (1978). The device is operable to fill in blank portions included in the image of the conductive pattern through image processing, to perform a predetermined pattern inspection on a pattern image thus obtained, where the blank portions correspond to the through holes.

The through holes may be classified into two types, through hole of relatively large diameter (hereinafter referred to as a "normal through holes") and through holes of relatively small diameter called "mini via holes". The normal through holes are used so that the leads of electronic parts may be inserted into the holes and fixed to the printed circuit board in order to electrically connect the leads to the conductive pattern. On the other hand, the mini via holes are used only for electrical connection between the respective conductive patterns formed on both surfaces of the printed circuit board through inner walls of the holes which are plated with metal. The conventional pattern inspection devices do not discriminate between these two types of through holes in processing.

In forming through holes in a printed circuit board, a conductive land breakage is sometimes caused by errors in drilling. FIG. 12A shows an example of the land breakage, in which a through hole 911 deviates from a land 912. The conventional inspection device cannot inspect the printed circuit board find such a land breakage.

There is a low probability that a normal through hole may cause a land breakage. However, there is a high probability that a mini via hole would cause the land breakage. This is because a land corresponding to the normal through hole is large in size and accordingly an error margin thereof is large, while a land corresponding to the mini via hole is small. When through holes including mini via holes are formed in a printed circuit board, the inspection of the all through holes is often suppressed indiscriminatingly because of the difficulty of the filling-in processing of the mini via holes. Therefore, there has been a problem that the conventional pattern inspection devices cannot perform the pattern inspection in the vicinity of through holes accurately and efficiently.

Another problem is that an excessively large number of pattern defects are detected in areas in which mini via holes are present when the inspection is carried out uniformly both in these areas and in areas in which normal through holes are present. This problem occurs also in a system in which an aperture angle $\theta$ of FIG. 12B is calculated to detect the pattern defect.

SUMMARY OF THE INVENTION

The present invention is directed to a method of inspecting a printed board. The printed board comprises an insulating board having a surface on which a conductive pattern is formed and a plurality of through holes.

The plurality of through holes includes a first type through hole (mini via hole) having a first diameter and a second type through hole (normal through hole) having a second diameter larger than the first diameter.

According to the present invention, the method comprises the steps of: (a) obtaining images of the plurality of through holes; (b) extracting an image of the first type through hole from the images of the plurality of through holes; (c) identifying a location of the image of the first type through hole on the surface of the printed board to obtain a first area of the surface in which the image of the first type through hole is located and a second area of the surface in which the first type through hole is not located; and (d) inspecting the first area in a first inspection mode and inspecting the second area in a second inspection mode different from the first inspection mode.

Preferably, the step (c) comprises the steps of: (c-1) enlarging the image of the first type through hole to obtain an enlarged first type hole image; and (c-2) obtaining a location of the enlarged first type hole image on the surface to determine the first and second areas.

In a preferred embodiment of the present invention, the step (c-1) comprises the steps of: (c-1-1) obtaining an image representing a first region including an edge of the conductive pattern; and (c-1-2) combining the image representing the first region with the enlarged first type hole image through a logical operation to determine the first and second areas.

In one form of the present invention, the method is conducted as follows:

First, an image of the conductive pattern and images of the plurality of through holes are obtain so that the image of the conductive image has hole parts corresponding to the plurality of through holes.

The images of the plurality of through holes are suggested into images of the first type through hole and images of the second type through hole. The hole portions of the image of the conductive pattern are filled with the image of the first type through hole and the image of the second type through hole image to obtain a corrected pattern image having no holes therein.

Then, the positional relation between the image of the first type through hole and the corrected pattern image on the surface of the objective printed board is identified to obtain a first area of the corrected pattern image overlapping the image of the first type through hole and a second area of the corrected pattern image not overlapping the first type through hole.

Inspection of the first area is conducted in a first inspection mode, while inspection of the second areas is conducted in a second inspection mode different from the first inspection mode.

The present invention also provides devices suitable for practicing the methods of the instant invention.

The first and second inspection modes for the first and second areas may be selected within the following modes:

(1) Inspection-ON and Inspection-OFF

An inspection is actually performed in an ON-mode, while no inspection is performed in an OFF-mode.

(2) Different Inspection Conditions

Inspection conditions form the basis for the decision of whether the printed circuit board is defective or not. The different inspection conditions may be characterized by different maximum allowed values for land breakage.

(3) Different Inspection Items

Different inspection items are assigned to the first and second inspection modes. For example, a pinhole inspection in the vicinity of lands is performed in the first area or lands having mini via holes, while a land breakage inspection is performed in the second area or lands having normal through holes.

In a uniform pattern inspection throughout the areas on the printed circuit board, there is a high possibility of detection of an excessively large number of practically harmless pattern defects such as land breakage in the vicinity of the mini via hole. In the present invention, the inspection mode is changed in the first area in which the mini via hole is present to improve the accuracy and efficiency of the pattern inspection.

Particularly, the above-indicated aspect of the present invention, in which the compensation is executable even if the land breakage is present, is suitable for the inspection using the corrected pattern image.

The corrected first and second type hole images are effective for compensating the hole parts in the pattern image if a gap resulting from the edge portion of the through hole (or an opening edge on the surface of the insulating plate) is present between the pattern image and the hole image. When the enlarged first type image is employed for switching the inspection mode, the area for which the inspection mode should be switched is securely specified.

Accordingly, an object of the present invention is to improve accuracy and efficiency of a pattern inspection of a printed circuit board including both a normal through hole and a mini via hole.

Another object of the present invention is to inspect a pattern in the vicinity of a through hole accurately and efficiently even if the pattern includes land breakages.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 6E-1, 6E-2 and 6E-3 illustrate logical processing for extracting a significant inspection area;

DESCRIPTION OF THE PREFERRED EMBODIMENTS

A. Structure

Figure 1A:
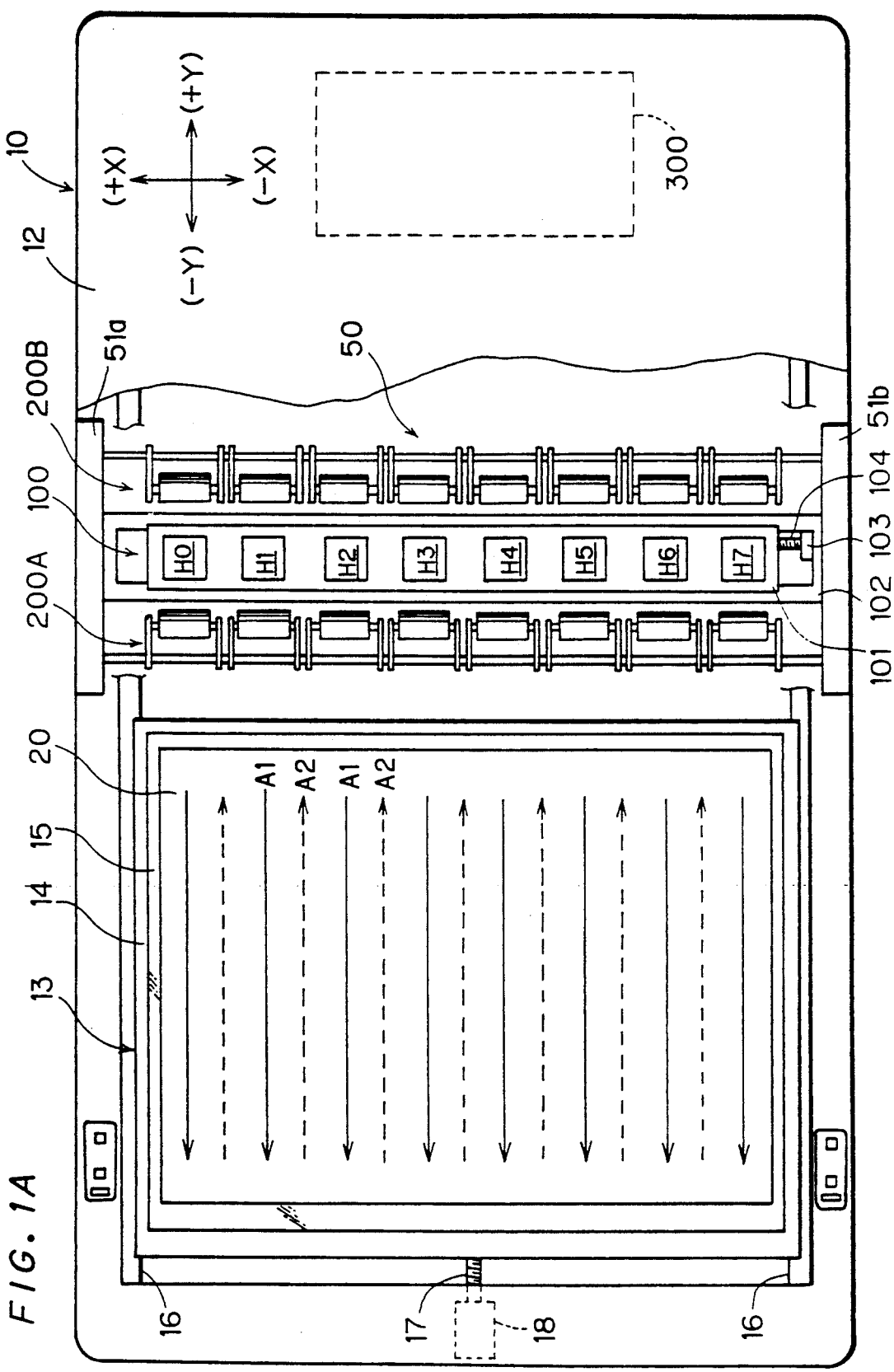
FIG. 1A is a plan view, with portions broken away, of a device for optically inspecting a printed circuit board according to a preferred embodiment of the present invention.
Figure 1B:
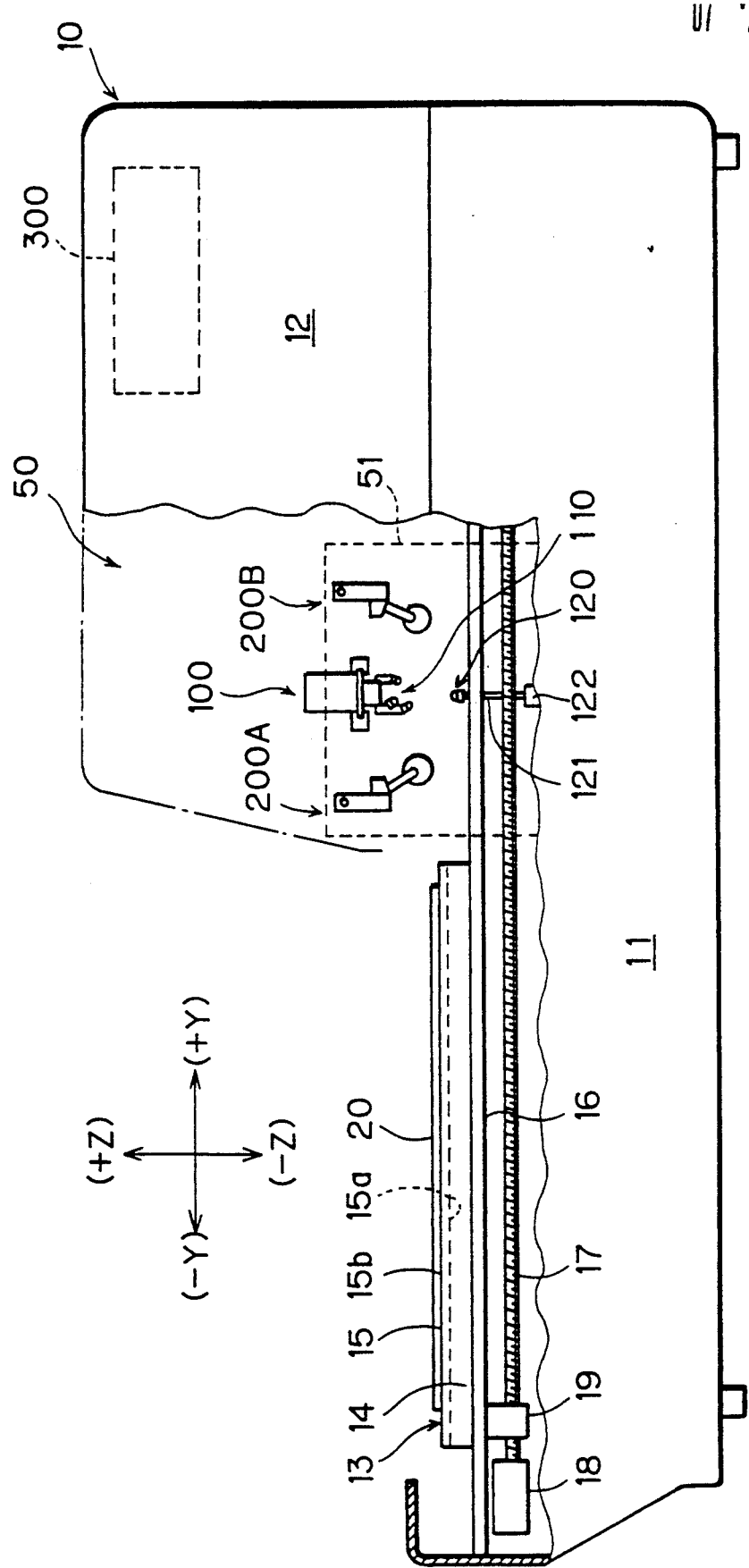
FIG. 1B is a side view, with portions broken away, of the device of FIG. 1A.

FIG. 1A is a plan view, with portions broken away, of a printed circuit board inspection device 10 according to a preferred embodiment of the present invention, and FIG. 1B is a side view thereof. The device 10 comprises a lower housing 11 and an upper housing 12. The lower housing 11 is provided with a horizontally movable table 13 in the vicinity of an opening on the top surface thereof. The movable table 13 includes a rectangular frame 14 and a glass plate 15 mounted in the rectangular frame 14. The bottom surface 15a of the glass plate 15 is frosted or coarsely ground. A printed circuit board 20 is placed on the top surface 15b of the glass plate 15 and is supported by the glass plate 15.

Figure 2:
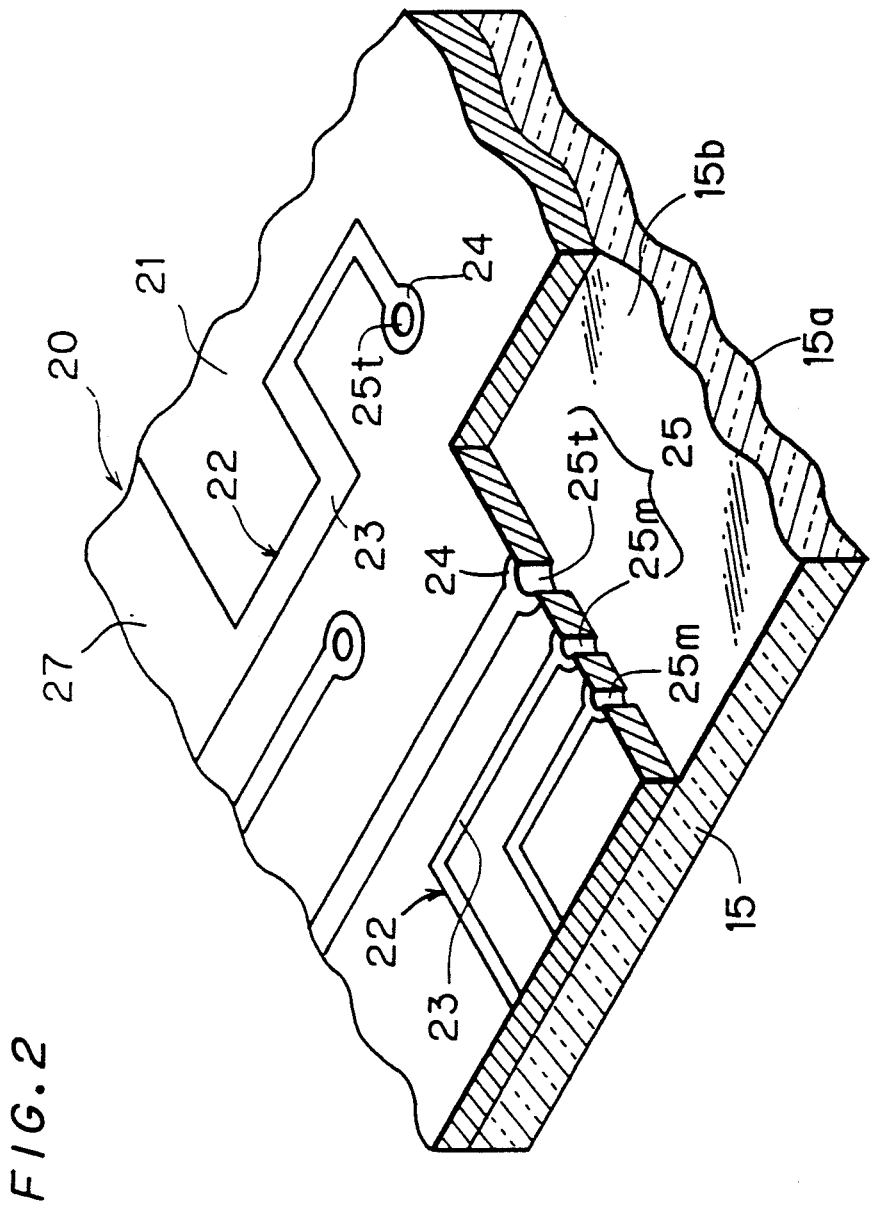
FIG. 2 shows an example of the printed circuit board.

With reference to FIG. 2, the printed circuit board 20 includes an insulative base plate 21 made of glass epoxy and printed patterns or conductive patterns 22 of copper formed on both surfaces thereof by means of screen printing or photo-etching techniques. The printed patterns 22 has wiring pattern portions 23, lands 24, and a shield portion 27. Each of the lands 24 is formed with a through hole 25 which pierces or penetrates through the printed circuit board 20. The through holes 25 are classified into two types, normal through holes 25t and mini via holes 25m. The normal through holes 25t, having a relatively large diameter, are used for mounting electronic elements and for connecting the electronic elements to the conductive patterns 22. The mini via holes 25m, having a relatively small diameter, are used for electrical connection between the surfaces of the insulative base plate 21. The inner wall surfaces of the through holes 25t and 25m are plated with conductive metal.

Reference is made again to FIGS. 1A and 1B. The frame 14 is slidable on a pair of guide rails 16. A ball screw 17 extends in the direction parallel to the guide rails 16. A nut 19 fixed to the frame 14 is coupled with the ball screw 17. When a motor 18 turns the ball screw 17, the movable table 13 moves in the horizontal (±Y) directions.

An image reading system 50 is provided in the upper housing 12. An optical head array 100 extending in the horizontal (±X) directions is disposed in a space over the mid portion of the image reading system 50. The optical head array 100 includes eight optical heads H0 to H7, which are supported at equal intervals by a supporting member 101. The supporting member 101 is slidable on a guide member 102 in the (±X) directions. The guide member 102 is fixed to a pair of side frame members 51a and 51b. The supporting member 101 is coupled to a motor 103 through a nut (not shown) and a ball screw 104. When the motor 103 is driven, the optical heads H0 to H7 move in the (±X) directions together with the supporting member 101.

A light source 120 for "transmitted illumination" is disposed under the optical heads H0 to H7, where "transmitted illumination" is defined as illumination applied to an object to be transmitted via the through holes formed in the object. The light source 120 is composed of a large number of infrared LEDs arranged in the (±X) directions, and serves substantially as a linear light source. The light source 120 is supported from the side frames 51 through supporting rods 121 and 122. Each of the optical heads H0 to H7 has a light source 110 for "reflected illumination", which light source 110 is attached to the bottom thereof. "Reflected illumination" is defined as illumination applied to an object and reflected at the surface of the object. The light source 110 includes three pairs of one-dimensional arrays of red LEDs extending in the (±X) directions.

Presser roller mechanisms 200A and 200B are provided on opposite sides of the optical head array 100 in order to press the printed circuit board 20 fed thereunder. The presser roller mechanisms 200A and 200B are operable to prevent out-of-deviations and flexure of the printed circuit board 20.

A data processor 300 for performing various data processings and operation controls is disposed in the upper housing 12.

B. Overall Operation

Prior to the describing the detailed structure of the inspection device 10, the overall operation of the device 10 will be discussed first. Initially, the printed circuit board 20 is placed on the glass plate 15 as shown in FIGS. 1A and 1B. When an operation switch is manually operated, the motor 18 is forwardly rotated so that the printed circuit board 20 moves in the (+Y) direction together with the movable table 13. The light sources 110 and 120 light up.

The printed circuit board 20 will then reach the position of the image reading system 50 as the table 13 moves. The optical heads H0 to H7 read the images of the printed patterns 22 (of FIG. 2) illuminated by the reflected illumination from the light source 110, while reading the images of the through holes 25 illuminated by the transmitted illumination from the light source 120. Respective image reading are conducted for each scanning line, schematically defined on the printed circuit board 20.

Since there are gaps between the visual fields of the respective optical heads H0 to H7 which are arranged in line, the whole image on the surface of the printed circuit board 20 cannot be read through movement of the printed circuit board 20 in the (+Y) direction. After the movement of the printed circuit board 20 in the (+Y) direction, the motor 103 is therefore driven to move the optical heads H0 to H7 in the (+X) direction. The distance of the movement in the (+X) direction is half the mutual arrangement pitch of the optical heads H0 to H7. After this movement, the motor 18 is reversely rotated. Accordingly, the printed circuit board 20 moves in the (−Y) direction, while the optical heads H0 to H7 read the remaining parts of the images of the wiring patterns 22 and the through holes 25.

As a result, both scans indicated by the solid arrows A1 and the broken arrows A2 of FIG. 1A are carried out, whereby image reading of the entire surface of the printed circuit board 20 can be accomplished. The images detected are supplied to the data processor 300, in which, whether the printed patterns 22 and the through holes 25 are defective or not, is decided on the bases of predetermined criteria.

C. Details of Optical Heads

Figure 3:
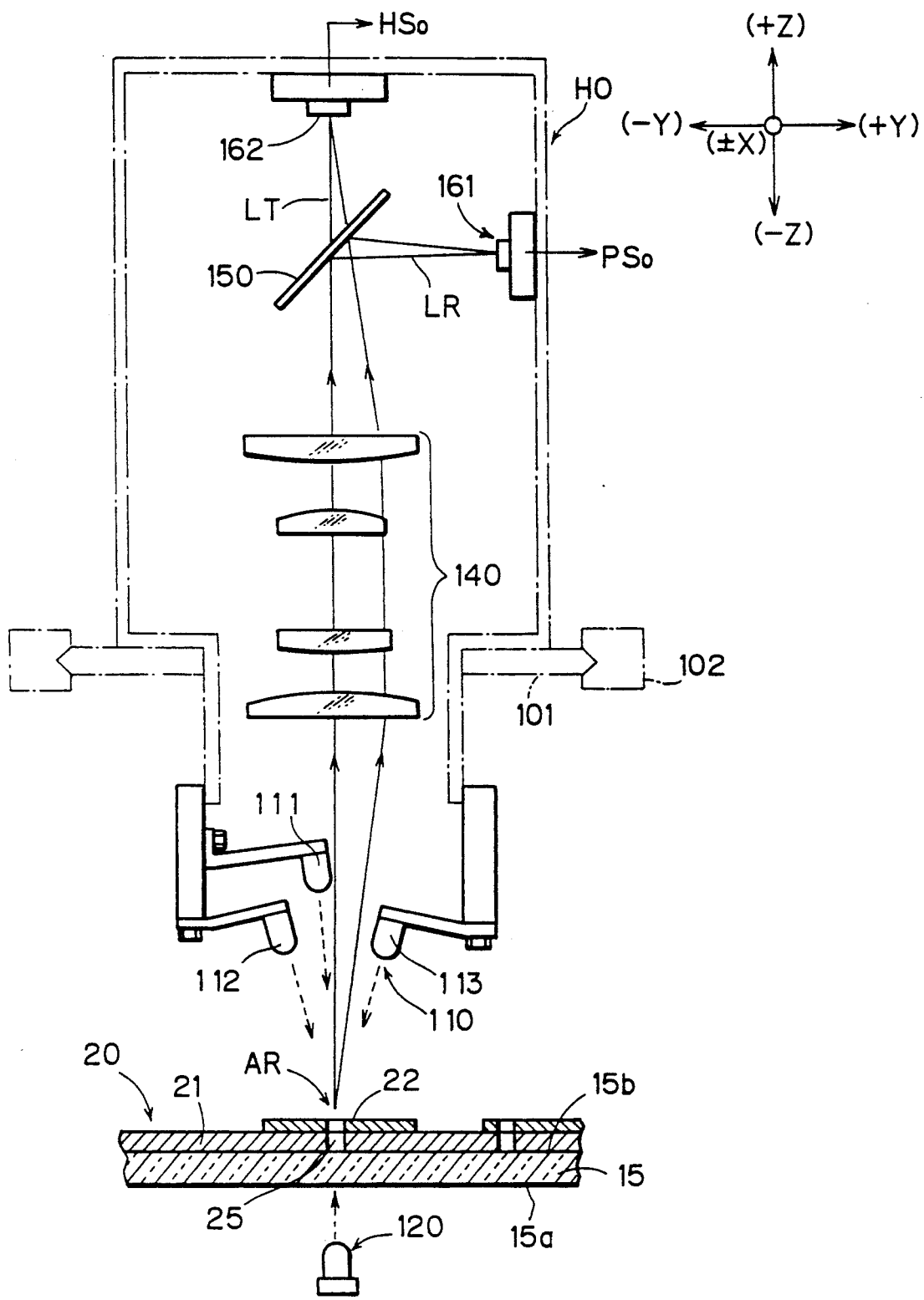
FIG. 3 is a schematic side view of an optical head employed in the preferred embodiment.

FIG. 3 is a schematic side view of the internal structure of the optical head H0. Although FIG. 3 shows only the optical head H0, the other optical heads H1 to H7 have the same structure.

The light source 110 for reflected illumination is composed of a light source 111 for regular reflection and light sources 112 and 113 for irregular reflection. Each of the light sources 111, 112 and 113 is substantially a linear light source composed of a one-dimensional array of red LEDs which generate red light of wavelength $\lambda_1$ (=600 to 700 nm).

Light from the light sources 111, 112 and 113 is applied to an area-to-be-inspected or objective area AR of the top surface of the printed circuit board 20 which is currently located just under the optical head H0.

The light source 120 for transmitted illumination is composed of a one-dimensional array of infrared LEDs which generate infrared light of wavelength $\lambda_2$ (=700 to 1000 nm). The light source 120 projects the infrared light in the (+Z) direction toward an area corresponding to the reverse side of the area AR in the printed circuit board 20.

Part of the red light generated in the light sources 111, 112 and 113 for reflected illumination reaches the area AR and is reflected at the area AR. Part of the infrared light from the light source 120 for transmitted illumination reaches the through holes 25 and passes through the through holes 25. The reflected light and the transmitted light thus obtained are directed to the optical head H0 as a spatially superposed compound light.

As shown in FIG. 3, the compound light passes through an image-formation lens system 140 and impinges on a cold mirror 150. The cold mirror 150 transmits only infrared rays. The red light (i.e., the reflected light LR from the surface of the printed circuit board 20) included in the compound light is reflected at the mirror 150 to the (+Y) direction so that an image is formed on a photodetecting surface of a first CCD linear image sensor 161. The infrared light (i.e., the transmitted light LT through the through hole 25) included in the compound light passes through the mirror 150 so that an image is formed on a photodetecting surface of a second CCD linear image sensor 162.

Each of the CCD linear image sensors 161 and 162 has CCD photo-electric cells arranged one-dimensionally in the (±X) directions. The first linear image sensor 161 detects the one-dimensional image of the surface of the printed circuit board 20 illuminated by the reflected illumination. The second linear image sensor 162 detects the one-dimensional image of the through hole 25 illuminated by the transmitted illumination. The movement mechanism shown in FIGS. 1A and 1B moves the printed circuit board 20 and the optical head array 100 relatively, thereby each area of the printed circuit board 20 is scanned. The two-dimensional images of the wiring pattern 22 and the through hole 25 for each area can be obtained.

D. Electric Structure and Operation

D-1. Overall Structure

Figure 4:
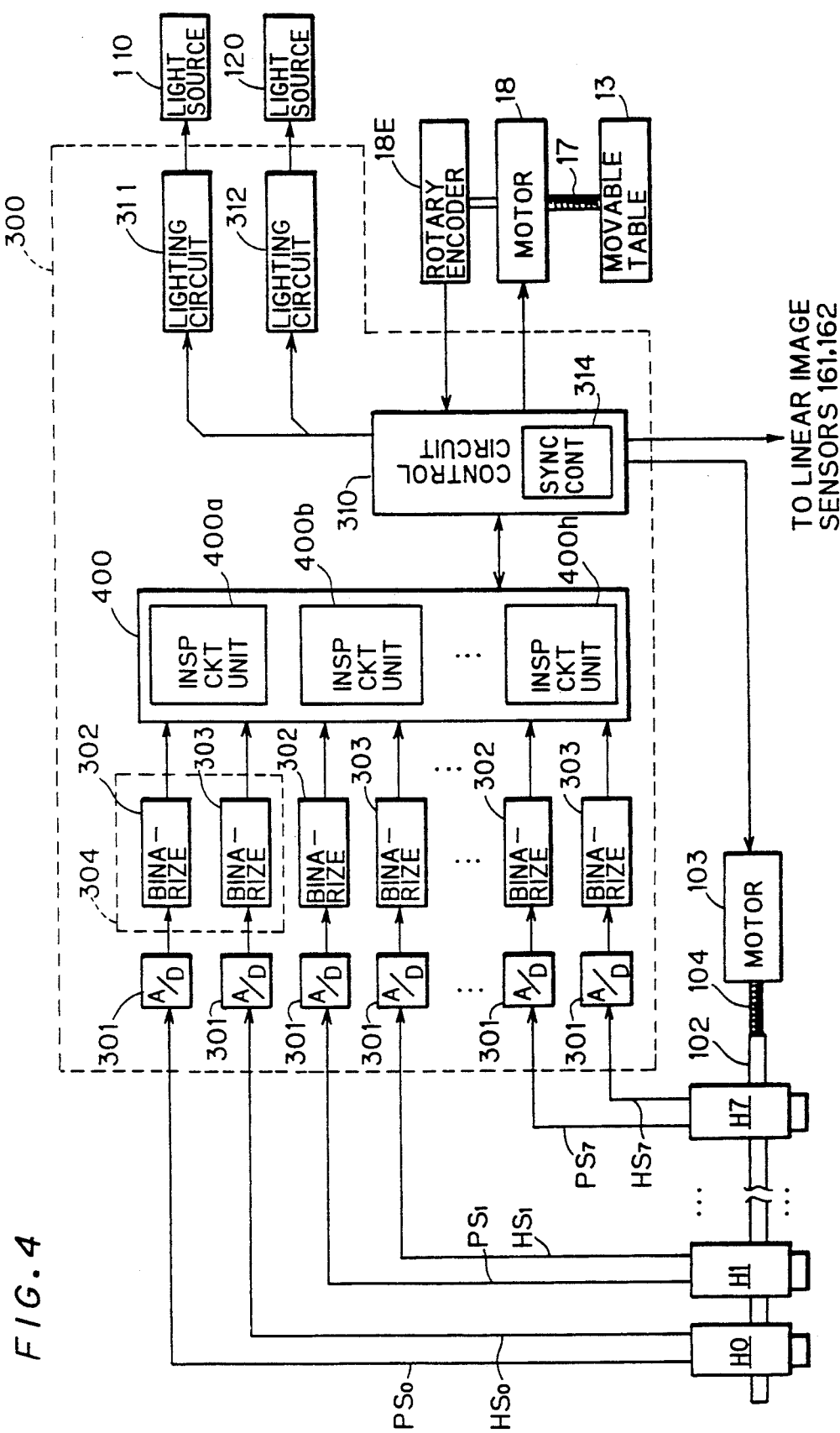
FIG. 4 is a block diagram of the entire electric structure of the preferred embodiment.

FIG. 4 is a block diagram of the overall electric structure of the preferred embodiment. A/D converters 301 receive wiring pattern image signals $PS_0$–$PS_7$ and through hole image signals $HS_0$–$HS_7$ from the optical heads H0 to H7, and convert them into digital signals. The digital signals are transmitted to circuits 304 each composed of binarizing circuits 302 and 303.

Figure 5A:
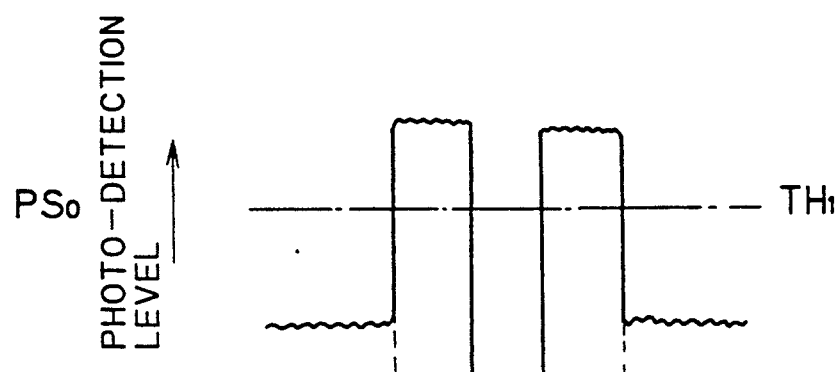
FIGS. 5(a) and 5(b) illustrate binarization of a printed pattern and a through hole.
Figure 5B:
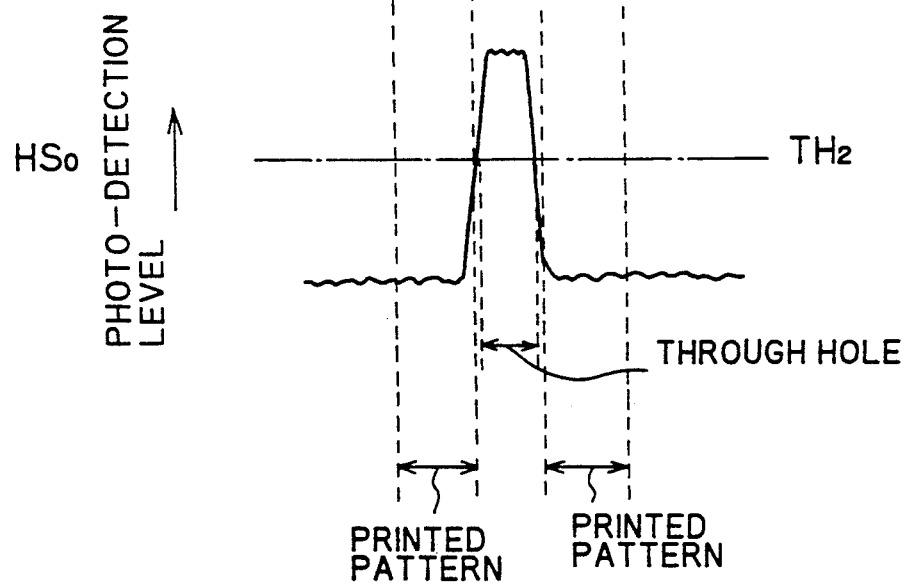

The binarizing circuits 302 and 303 respectively compare the digitized image signals $PS_0$ and $HS_0$ with predetermined threshold values TH1 and TH2 (see FIGS. 5(a) and 5(b)) to output binarized signals. The binarized signals are at a logical "H" level when the levels of the signals $PS_0$ and $HS_0$ are higher than the threshold values TH1 and TH2, and at a logical "L" level when the levels of the signals $PS_0$ and $HS_0$ are respectively lower than the threshold values TH1 and TH2. The binarizing circuits 302 and 303 corresponding to the other optical heads H1 to H7 have the same structure.

The binarized image signals thus obtained are transmitted to a pattern inspection system 400. The pattern inspection system 400 includes eight inspection circuit units 400a to 400h corresponding to the optical heads H0 to H7. The units 400a to 400h construct the two-dimensional images of the printed patterns 22 and the through holes 25 based on the image signals which are supplied from the optical heads H0 to H7 and digitalized in the circuits 302 or 303. The units 400a to 400h are operable to decide whether or not the printed patterns 22 and the through holes 25 are defective based on predetermined criteria.

The data processor 300 further comprises a control circuit 310. The control circuit 310 applies turn on/off commands to the light sources 110 and 120 through lighting circuits 311 and 312, and outputs drive control signals to the motors 18 and 103. The motor 18 is equipped with a rotary encoder 18E, which detects a motor rotation angle signal. The motor rotation angle signal for ruling data processing timing is given to the control circuit 310.

The control circuit 310 includes a synchronization control circuit 314 for controlling the read timing of the linear image sensors 161 and 162 and the synchronization of the motors 18 and 103.

D-2. Pre-processor

Figure 6A:
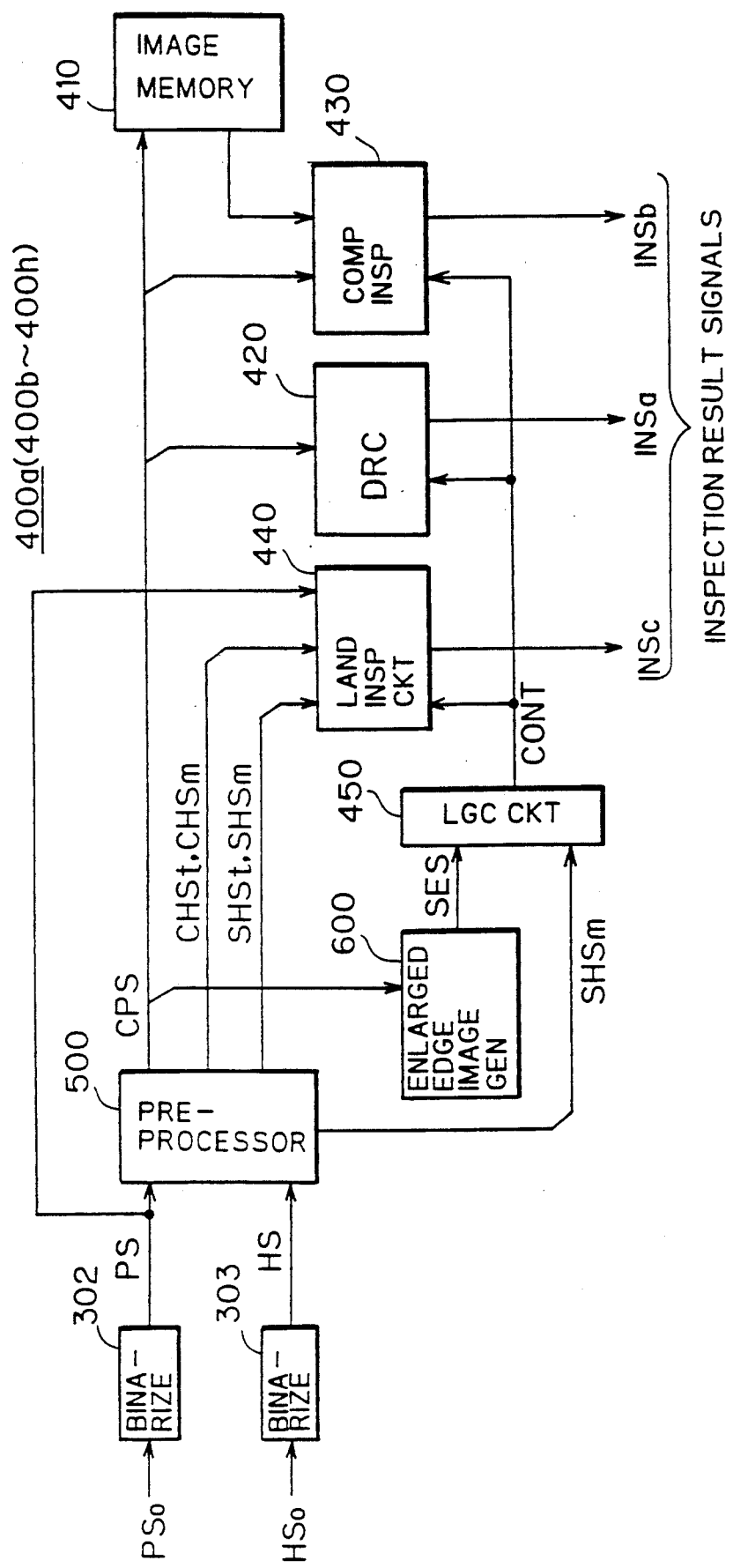
FIG. 6A is a block diagram of the internal structure of an inspection circuit unit.

FIG. 6A is a block diagram of the internal structure of the inspection circuit unit 400a. The other inspection circuit units 400b to 400h have the same structure.

The image signals PS and HS outputted from the binarizing circuits 302 and 303 are given to a pre-processor 500 as a pattern signal PS and a hole signal HS indicative of the two-dimensional images of the printed pattern 22 and the through hole 25, respectively. The pre-processor 500 generates various signals based on the pattern signal PS and the hole signal HS.

Figure 6B:
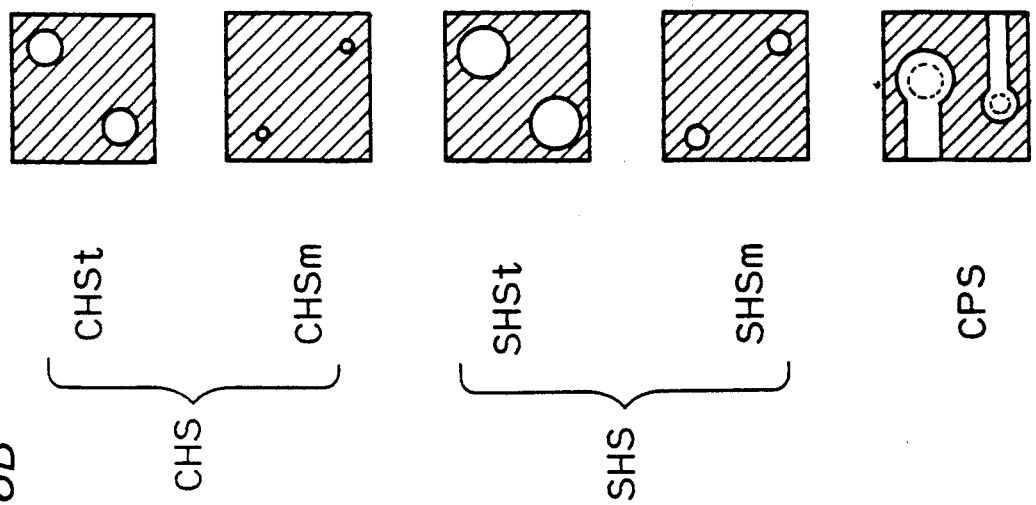
FIG. 6B illustrates signals produced in a pre-processor.

Major ones among the various signals are as follows (see FIG. 6B):

(1) Corrected hole signal CHS

The signal CHS represents a corrected hole image having a diameter obtained by slightly enlarging the diameter of the through hole 25. The corrected hole signal CHS is generated in connection with detection of the inner wall of the through hole 25. Namely, the inner wall of the through holes 25 is planted with metal, and the inner wall is sometimes detected neither in the pattern signal PS nor in the hole signal HS. Hence, the hole signal HS is enlarged or corrected to close or compensate for a gap caused between the signals PS and HS due to such an undetected portion. The corrected hole signal CHS includes a signal CHSt corresponding to the normal through hole 25t and a signal CHSm corresponding to the mini via hole 25m.

(2) Enlarged hole signal SHS

The signal SHS represents an image obtained by further enlarging the hole diameter represented by the corrected hole signal CHS. The enlarged hole signal SHS includes an enlarged normal through hole signal SHSt and an enlarged mini via hole signal SHSm.

(3) Compensated pattern signal CPS

This is a signal in which a blank portion (or the center portion of FIG. 5(a)) corresponding to the through hole 25 in the pattern signal PS is filled in with a logical level "H". The signal CPS is the logical summation of the corrected hole signal CHS and the pattern signal PS (see FIG. 6D). The signal CPS is also referred to as the "corrected pattern signal" hereinafter.

These signals are used for various purposes. There are shown in FIG. 6A only some of the signals outputted from the pre-processor 500 which are necessary for the following description.

Figure 6D:
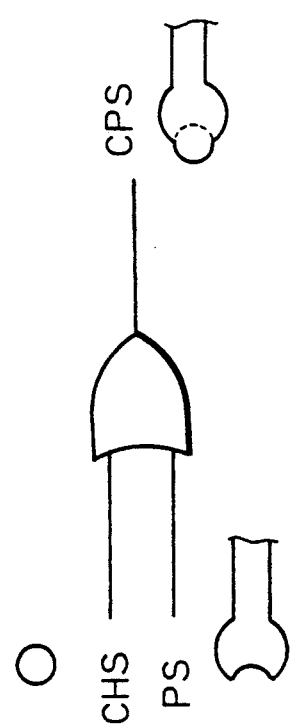
FIG. 6D shows an example of a circuit structure for a compensation processing.
Figure 6C:
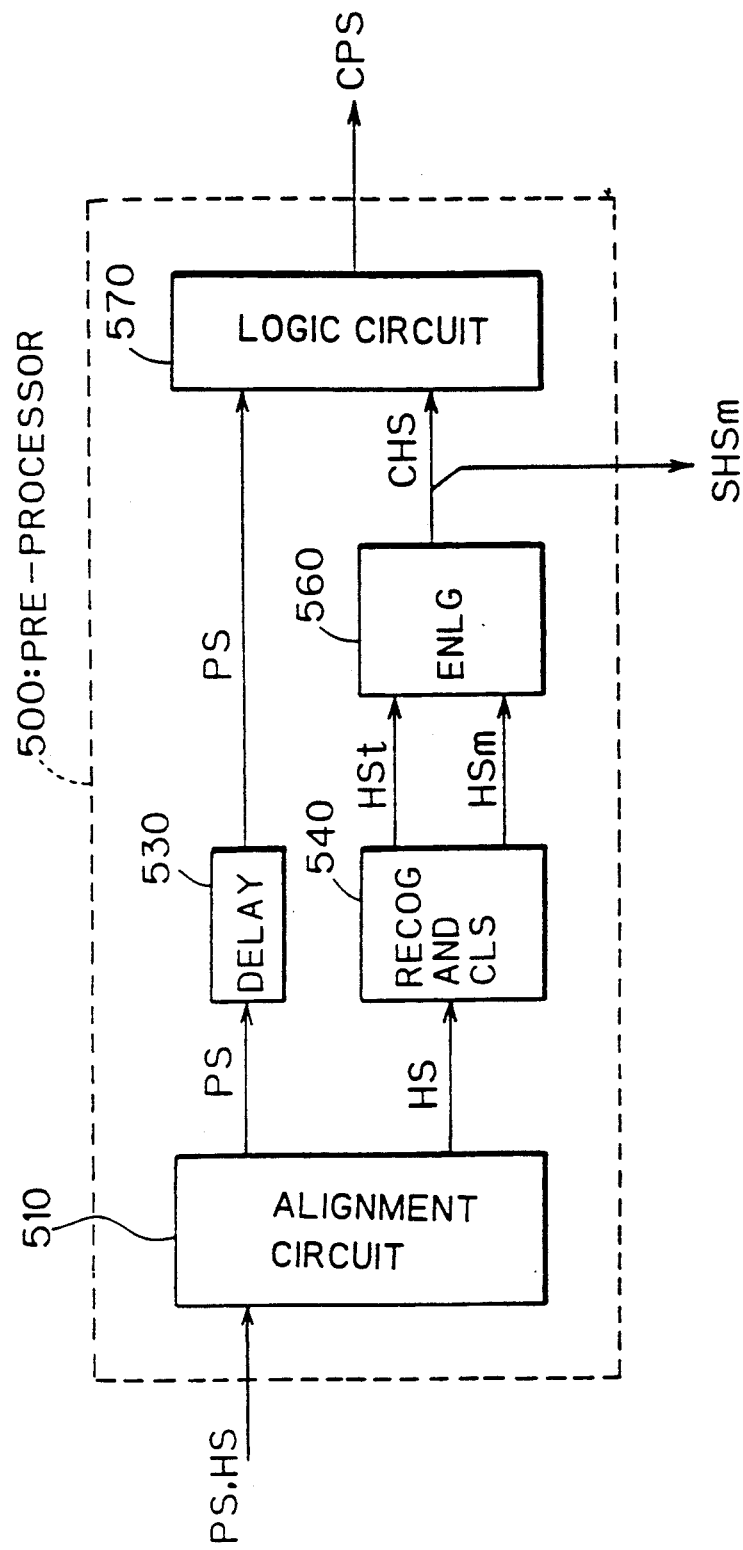
FIG. 6C is a block diagram of the internal structure of the pre-processor.

FIG. 6C shows the internal structure of the pre-processor 500 for producing these signals. The signals PS and HS are supplied to an alignment circuit 510, in which correction is made in the phase shift or positional shift between the signals PS and HS due to the mutual positional deviation of the CCD linear image sensors 161 and 162. The hole signal HS is transmitted to a recognition and classification circuit 540, so that respective signal levels of the hole signal HS are classified or divided into a normal through hole signal HSt indicative of the normal through hole 25t and a mini via hole signal HSm indicative of the mini via hole 25m.

D-2-1. Recognition and Classification Circuit

Figure 7:
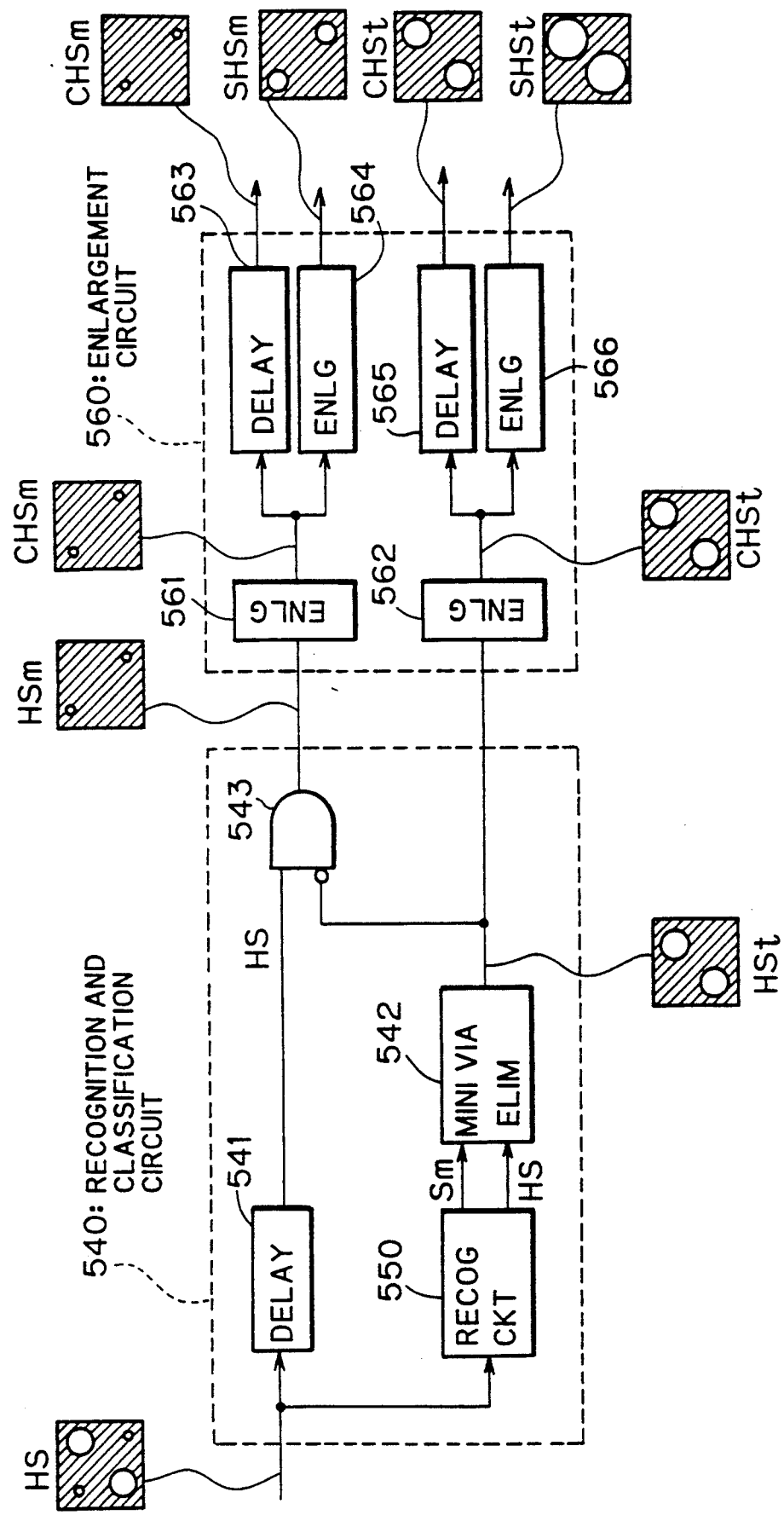
FIG. 7 is a block diagram of the internal structure of a recognition classification circuit and an enlargement circuit.
Figure 9:
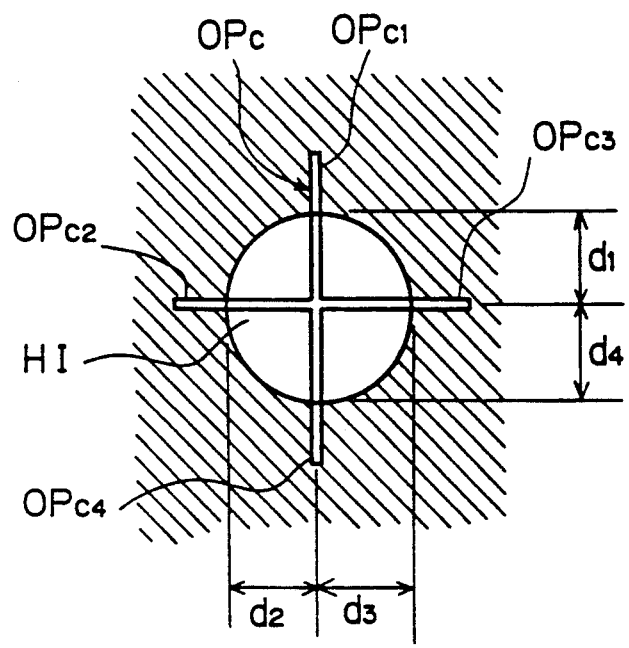
FIGS. 9 and 10 illustrate an operation for detecting a mini via hole.

The internal structure of the recognition and classification circuit 540 is shown in FIG. 7. The hole signal HS is sent to a recognition circuit 550. The recognition circuit 550 applies a cross-shaped spatial operator $OP_c$ shown in FIG. 9 to a hole image HI represented by the hole signal HS. Since the hole signal HS is inputted in a time series, the spatial operator $OP_c$ relatively scans the image represented by the hole signal HS. Respective arms $OP_{c1}$ to $OP_{c4}$ of the spatial operator $OP_c$ extract pixels having the logical level "H" from pixels which overlap the respective arms $OP_{c1}$ to $OP_{c4}$. If the device is constructed such that the signal HS has a logical "H" level in through holes, the operator OPC may include an AND operator. If the device is constructed such that the signal HS has a logical "L" level in through holes, the operator OPC may include an Exclusive-OR operator. The number of consecutive pixels having the "H" level is found for each arm $OP_{c1}$ to $OP_{c4}$, whereby distance signals indicative of the distances $d_1$ to $d_4$ in which respective arms $OP_{c1}$ to $OP_{c4}$ are overlapped with the hole image HI are generated. When the distances $d_1$ to $d_4$ are equal to a common value d (not shown) within a predetermined tolerance, the value d is taken as the radius of the hole HI. The radius d is compared with a predetermined threshold value $d_{TH}$. The hole image HI is judged as the image of the mini via hole 25m where the following expression (1) holds, while the hole image HI is judged as the image of the normal through hole 25t when the expression (1) does not hold.

$$d < d_{TH} \qquad (1)$$

Figures 8A, 8B:
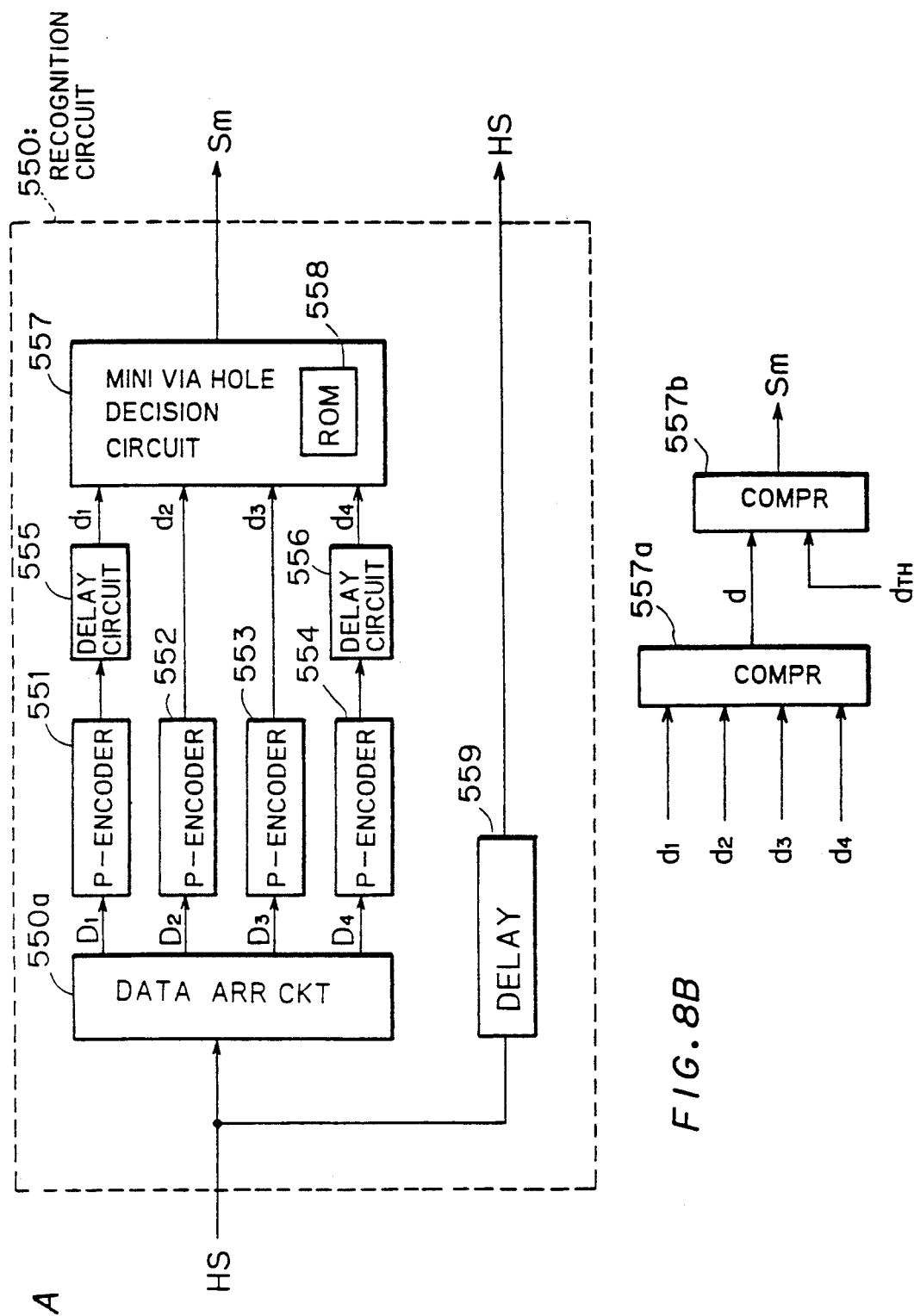
FIG. 8A is a block diagram of the internal structure of a recognition circuit.
FIG. 8B is a block diagram equivalent to a mini via hole decision circuit.
Figure 10:
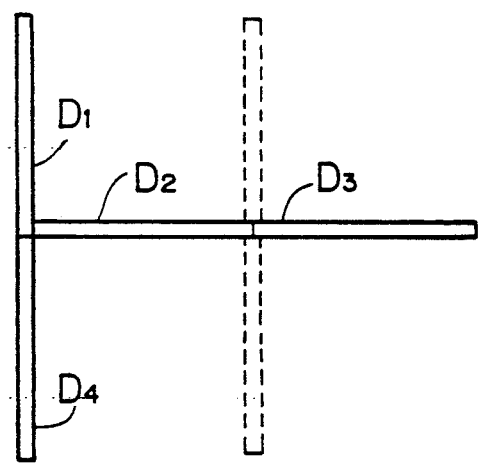
Figure 10:
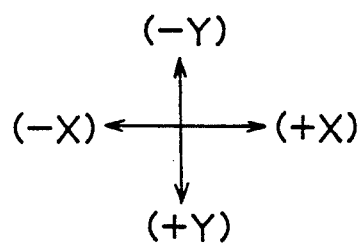

FIG. 8A is a block diagram of the recognition circuit 550 for attaining such functions. The hole signal HS is given to a data re-arrangement circuit 550a, in which the hole signal HS is converted into a data train $D_1$ to $D_4$ corresponding to a spatial arrangement shown in FIG. 10. The data train $D_1$ to $D_4$ is applied to priority encoders 551 to 554 (shown as "P-encoders" in FIG. 8A). The priority encoders 551 to 554 count and encode the number of consecutive pixels having the "H" level to calculate the distances $d_1$ to $d_4$. The signals $d_1$ and $d_4$ are sent to delay circuits 555 and 556 to be delayed for compensating the deviation of the data train $D_1$ and $D_4$ of FIG. 10 from the position indicated by the broken lines (or the cross position corresponding to the operator $OP_c$).

The distance signals $d_1$ to $d_4$ thus phase-adjusted are sent to a mini via hole decision circuit 557. The circuit 557 includes a ROM table 558. The combination of the distance signals $d_1$ to $d_4$ is inputted to the ROM table 558 as an address signal. The data are previously stored in the ROM table 558 such that the ROM table 558 outputs a mini via hole recognition signal Sm which becomes "H" only where the common value d is smaller than the threshold value $d_{TH}$ when all of the distances $d_1$ to $d_4$ are equal to the common value d within the tolerance. The mini via hole decision circuit 557 is substantially equivalent to the combination of comparators 557a and 557b shown in FIG. 8B. The threshold value $d_{TH}$ is determined by using the respective design maximum diameters of the normal through hole 25t and the mini via hole 25m. For example, the threshold value $d_{TH}$ may be a value between the design minimum diameter of the normal through hole 25t and the design maximum diameter of the mini via hole 25m. In FIG. 8A, the hole signal HS is outputted from the recognition circuit 550 through a delay circuit 559 having the same delay time as the processing delay time in the circuits 550a, 551 to 557.

Referring again to FIG. 7, the signals Sm and HS are applied to a mini via hole elimination circuit 542. The circuit 542 fills in the area of the mini via hole included in the hole signal HS with a logical level "L" when the mini via hole 25m is recognized by the signal Sm. This processing can be achieved by finding the logical product of a circular "L" image having a diameter slightly larger than the maximum diameter of the mini via hole and the hole image represented by the hole signal HS. Hence, the signal outputted from the circuit 542 is the normal through hole signal HSt including only the normal through hole 25t.

The hole signal HS is also applied to a delay circuit 541 having the same delay time as the processing delay time in the circuits 550 and 542. An AND gate 543 finds the logical product of the hole signal HS and the inversion signal of the normal through hole signal HSt. The logical product is the mini via hole signal HSm including only the mini via hole 25m. As a whole, the recognition and classification circuit 540 extracts and separates the normal through hole signal HSt and the mini via hole signal HSm from the hole signal HS. The signals HSt and HSm are delivered to an enlargement circuit 560.

D-2-2. Enlargement Circuit

The hole images represented by the signals HSt and HSm are slightly enlarged by first enlargement blocks 561 and 562 in the enlargement circuit 560 to become the corrected hole signals CHSt and CHSm representing the corrected hole images. The corrected hole images represented by the corrected hole signals CHSt and CHSm are further enlarged by second enlargement blocks 564 and 566 to become the enlarged hole signals SHSt and SHSm representing the enlarged hole images. The enlargement circuit 560 outputs the enlarged hole signals SHSt and SHSm and the corrected hole signals CHSt and CHSm which are delayed by delay blocks 563 and 565 for the same delay time as the processing delay time in the second enlargement blocks 564 and 566. The blocks 561-566 may be hardware circuits, or alternatively, they may be microcomputers controlled by software programs.

D-2-3. Logical Synthesis

The enlarged hole signals CHSt and CHSm are transmitted to a logical synthesis circuit 570 shown in FIG. 6C. The pattern signal PS is also inputted to the logical synthesis circuit 570 through a delay circuit 530. The delay circuit 530 delays the signal PS for the same delay time as the processing delay time in the recognition and classification circuit 540 and the enlargement circuit 560.

As shown in FIG. 6D, the logical synthesis circuit 570 calculates the logical summation of the enlarged hole signal CHS and the pattern signal PS to generate a compensated or corrected pattern signal CPS representing an image in which holes are filled.

Described above were the main structure and function of the pre-processor 500.

D-3. Inspection Circuits

The inspection circuit unit 400a of FIG. 6A includes the following three types of inspection circuits for pattern inspection.

(1) DRC (Design Rule Check) Circuit 420

The DRC circuit 420 extracts the characteristics of the pattern on the printed circuit board 20, e.g., a line width and a pattern angle, and the continuity of the pattern, and decides whether or not they deviate from design values, to thereby inspect the structured integrity of the printed circuit board 20. A DRC method (or a characteristic extraction method) is disclosed for example in Japanese Patent Laid-Open Gazette No. 57-149905 (1982),.

(2) Comparison Inspection Circuit 430

This circuit 430 compares or collates the image signal obtained from the objective printed circuit board 20 to be inspected with an image signal obtained from a reference printed circuit board prepared in advance to specify a difference between them as a defect. The reference printed circuit board is the same type as the objective printed circuit board 20 and has been judged as excellent. This method (a comparison method) is disclosed in Japanese Patent Laid-Open Gazette No. 60-263807 (1975), for example.

(3) Land Inspection Circuit 440

The circuit 440 inspects land breakages and the like resulting from the relative positional deviations between the lands and the holes, using the pattern signal PS, the corrected hole signals CHSt, CHSm and the enlarged hole signals SHSt, SHSm, to output an inspection result signal $INS_c$. The land inspection circuit 440 can additionally perform the function of switching between an inspection mode for a land portion including the mini via hole and an inspection mode for a land portion including the normal through hole.

Since the device of the preferred embodiment needs the information of the image of the reference printed circuit board, the reference printed circuit board is placed on the table 13 to carry out the image reading thereof before the image reading of the objective printed circuit board 20 to be inspected. While the reference printed circuit board is read, the signal CPS produced by the pre-processor 500 is applied to and stored in an image memory 410. The address generation timing of the image memory 410 is controlled by the synchronization control circuit 314 of FIG. 4.

D-4. Extraction and Enlargement of Edge

The corrected pattern signal CPS produced in the pre-processor 500 (FIG. 6A) is also applied to an enlarged edge image generation circuit 600. The circuit 600 extracts the edge image of the conductive pattern on the reference printed circuit board and expands the width of the edge image to generate an enlarged edge image. The enlarged edge image is stored in an area memory (not shown) provided in the circuit 600.

D-5. Inspection Operation

After the above-mentioned processing of the reference printed circuit board is completed, the reference printed circuit board on the table 13 is replaced with the objective printed circuit board 20 to be inspected. The image reading of the printed circuit board 20 then starts. The signal CPS outputted from the pre-processor 500 of FIG. 6A is applied to the DRC inspection circuit 420 and to the comparison inspection circuit 430. In synchronism therewith, the corrected pattern signal CPS of the reference printed circuit board stored in the image memory 410 is read out and inputted to the comparison inspection circuit 430.

The DRC inspection circuit 420 and the comparison inspection circuit 430 carry out the inspections based on the input signals to output inspection result signals $INS_a$ and $INS_b$, respectively. Since the area having the land breakage has been compensated, the DRC inspection and the comparison inspection are executable. In the comparison inspection, for example, the compensated pattern image of the printed circuit board 20 to be inspected is compared with the compensated pattern image of the reference printed circuit board. When a difference which is greater than a predetermined tolerance is found between the compensated pattern images, the comparison inspection circuit 430 outputs the inspection result signal $INS_b$ indicating that the pattern is defective.

The enlarged mini via hole signal SHSm outputted from the pre-processor 500 is supplied to a logical synthesis circuit 450 (FIG. 6A). In synchronism therewith, an enlarged edge signal SES is read out from the area memory in the enlarged edge image generation circuit 600 for each scanning line and is given to the logical synthesis circuit 450. The logical synthesis circuit 450 calculates the logical product of the enlarged mini via hole signal SHSm and the enlarged edge signal SES to output an inspection control signal CONT (FIG. 6E). The inspection control signal CONT is "H" in an area (hereinafter referred to as a "significant inspection area") in which the mini via hole 25m is absent within the enlarged edge image, while it is "L" in the remaining area. The inspection control signal CONT is applied to the inspection circuits 420, 430 and 440, thereby different inspection modes are assigned to the significant inspection area and the other area. The significant inspection area is limited to the area within the enlarged edge image, in addition to the exclusion of the mini via hole 25m from the significant inspection area, because only the defect in the vicinity of the edge of the conductive pattern 22 is significant for quality control.

Figure 11A:
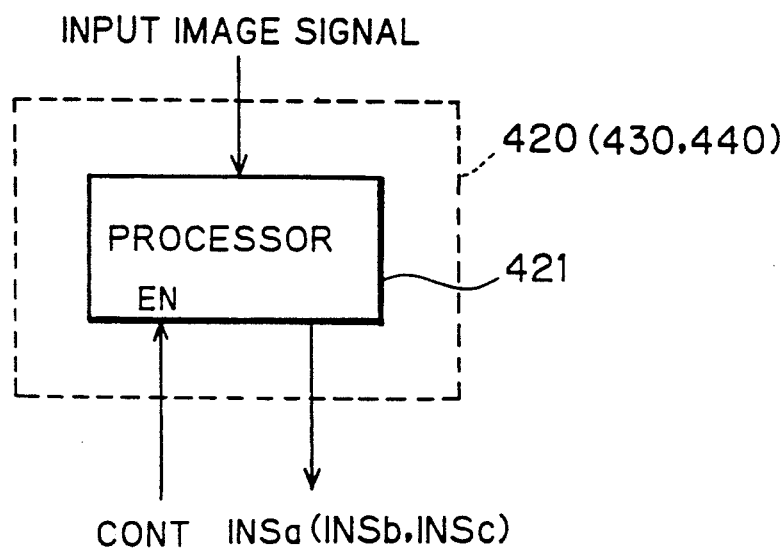
FIGS. 11A to 11D illustrate examples of a structure for switching an inspection mode by a control signal.

FIGS. 11A to 11D illustrate examples of the structure for switching the inspection mode, respectively. In FIGS. 11A to 11D, the two types of inspection circuits 420, 430 and 440 are both shown, and the contents of the "processor" and the "input image signal" are different based on the inspection circuits 420, 430 and 440. For ease of understanding, the "processor" hardware is shown in FIGS. 11A to 11D. However, a substantially similar function to that obtained with the "processor" is attainable by means of software. In the example of FIG. 11A, the inspection control signal CONT is used as an enabling signal for a processor 421, which is enabled only in the significant inspection area. This provides an inspection inhibit mode in the area other than at the significant inspection area. As a result, the signal level indicative not defective is always outputted as the inspection result signal $INS_a$ (or $INS_b$, $INS_c$) in the area other than at the significant inspection area.

Figure 11B:
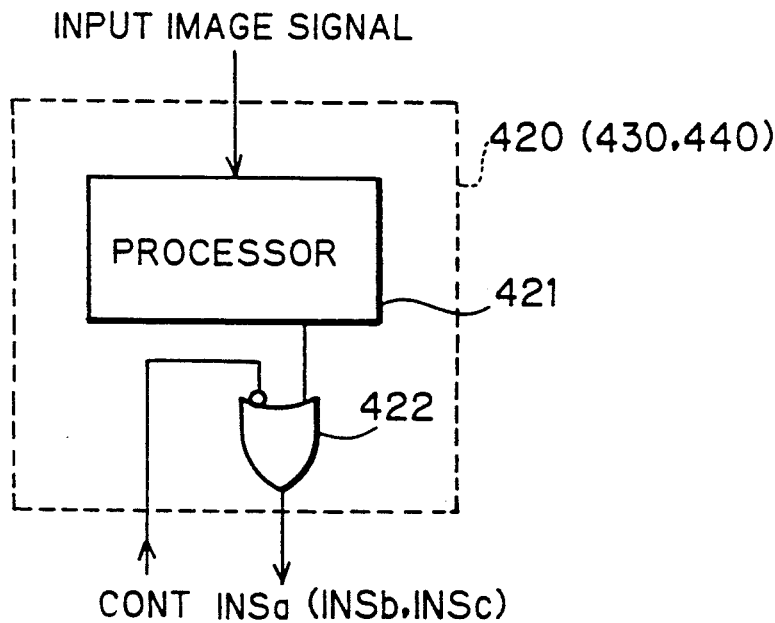

FIG. 11B shows an example of switching between the inspection execution mode and the inspection inhibit mode, which are similar to those of FIG. 11A and implemented, by means of an OR gate 422, where the inspection result signal $INS_a$ (or $INS_b$, $INS_c$) at the "H" level indicates "not defective". The inspection control signal CONT is "H" in the significant inspection area, while it is "L" in the other area.

Figure 11C:
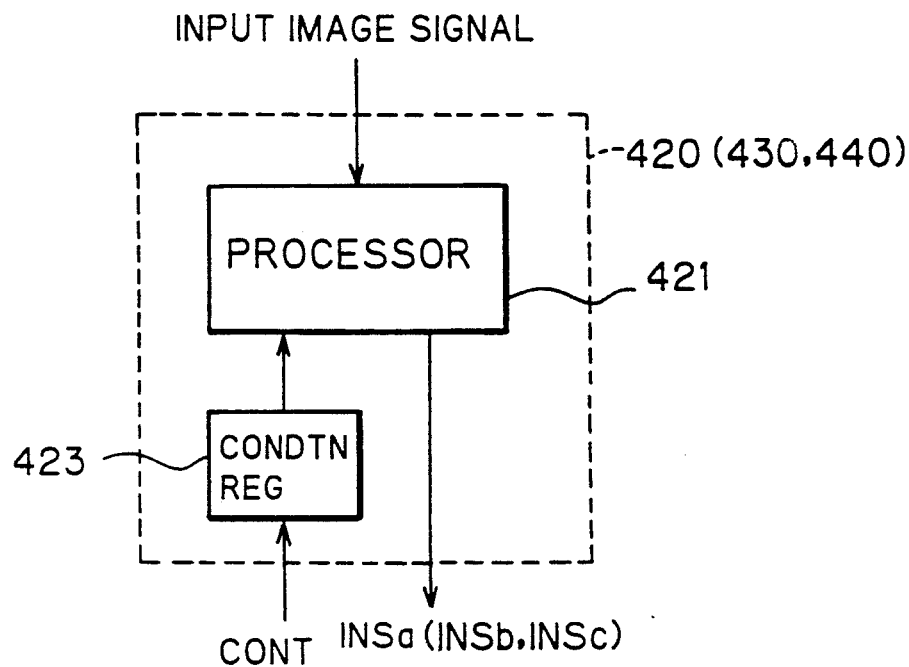

In the structure of FIG. 11C, a plurality of different inspection condition data are previously stored in a condition register 423. In the significant inspection area, a relatively strict inspection condition (or a defect decision condition) is read out from the register 423 in response to the inspection control signal CONT and is inputted to the processor 421. In the other area including the image of the mini via hole, a relatively loose inspection condition is read out from the register 423 and is inputted to the processor 421. The processor 421 switches the inspection mode in accordance the inputted inspection condition.

Figure 11D:
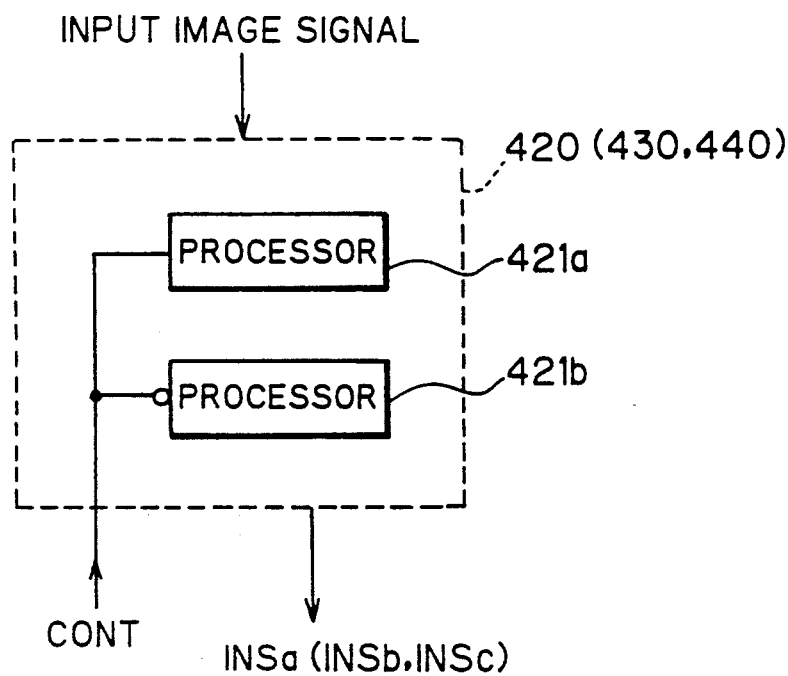
Figure 12A:
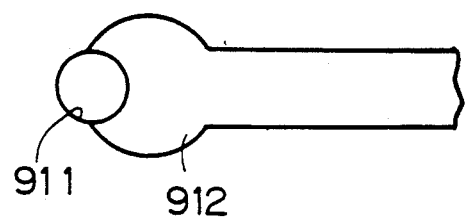
FIGS. 12A and 12B illustrate land breakages.
Figure 12B:
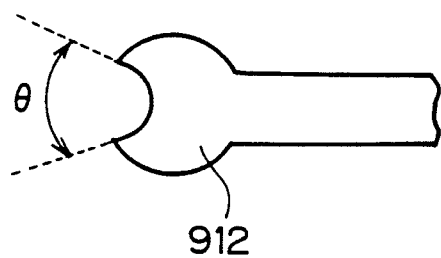

In the example of FIG. 11D, there are provided a plurality of processors 421a and 421b corresponding to different inspection items. Either of the processors 421a or 421b is enabled selectively depending on the level of the inspection control signal CONT. The inspection items are substantially switched. For example, land breakage inspection is performed in the significant inspection area, while a pinhole inspection in the vicinity of lands is performed in areas having mini via holes.

In the device of the preferred embodiment, the mini via holes 25m and its adjacent areas are excluded from the significant inspection area. An excessively large number of practically harmless land breakages in the vicinity of the mini via holes 25m are not detected, so that nondefective printed circuit boards are not judged to be "defective". As a result, the accuracy and efficiency of the pattern inspection are improved.

E. Modifications (1) When an image reading system having no transmission light source is employed, two threshold values TH1 and TH2 may be applied to the photo-detection level of the light reflected from the printed circuit board 20 to provide the pattern image and the hole image.

(2) It is preferable to specify the significant inspection area by the combination of the enlarged edge image and the enlarged mini via hole signal SHSm. However, the inspection mode may be switched by using only the enlarged mini via hole signal SHSm.

(3) In FIG. 6A, the following modification is applicable. The enlarged normal through hole signal SHSt (see FIG. 7) outputted from the pre-processor 500 is given to the logical synthesis circuit 450. The logic synthesis circuit 450 calculates the logical product of the enlarged normal through hole signal SHSt and the enlarged edge signal SES to generate an inspection control signal which is different from the inspection control signal CONT. The inspection control signal is given to the DRC inspection circuit 420 and the comparison inspection circuit 430. Each of the inspection circuit 420 and 430 switches the inspection mode among the area corresponding to the mini via hole, the area corresponding to the normal through hole, and the other area, e.g., the area corresponding to the wiring pattern.

(4) There may be provided respective memories for storing the enlarged mini via hole signal SHSm and the enlarged normal through hole signal SHSt prior to the logical synthesis circuit 450 (of FIG. 6A) proceeding to read out the signals SHSm and SHSt in synchronism with the enlarged edge signal SES.

(5) When the enlargement of the pattern image can compensate a gap generated between the hole image and the pattern image due to the plating metal layer on the inner wall of the through hole, the pattern image can be compensated by the use of the hole signals HSt and HSm which have not been corrected.

When the enlarged mini via hole signal is used for the switching of the inspection mode, the area in which the mini via hole is present and its adjacent area can be securely recognized, as described in the preferred embodiment. In principle, the switching of the inspection mode can be carried out by means of the information of the image of the mini via hole, and is not limited to the structure of the preferred embodiment.

(6) The DRC inspection circuit 420 has the advantage of the specification of permitting defect contents. The comparison inspection circuit 430 is advantageous in that it can inspect the printed circuit board having an arbitrary pattern. Therefore, it is preferable to employ both of the inspection circuits 420 and 430 as in the preferred embodiment. The present invention is, however, applicable independent of the type of inspection circuit to be employed.

While the invention has been shown and described in detail, the foregoing description is in all aspects illustrative and not restrictive. It is therefore to be understood that numerous modifications and variations can be devised without departing from the scope of the invention.

We claim:

1. A method of inspecting a printed board comprising an insulating board having a surface on which a conductive pattern is formed and through which a plurality of through holes extend, wherein said plurality of through holes includes a first type through hole having a first diameter and a second type through hole having a second diameter larger than said first diameter, said method comprising the steps of:
   (a) obtaining images of said plurality of through holes;
   (b) developing an image of said first type through hole from said images of said plurality of through holes;
   (c) identifying a location of said image of said first type through hole in said surface of said printed board to obtain a first area of said surface in which said image of said first type through hole is located and a second area of said surface in which said first type through hole is not located; and
   (d) inspecting said first area in a first inspection mode and inspecting said second area in a second inspection mode different from said first inspection mode.

2. The method of claim 1, wherein
   the step (c) comprises the steps of:
   (c-1) enlarging said image of said first type through hole to obtain an enlarged first type hole image; and
   (c-2) obtaining a location of said enlarged first type hole image on said surface to determine said first and second areas.

3. The method of claim 2, wherein
   the step (c-1) comprises the steps of:
   (c-1-1) obtaining an image representing a first region including an edge of said conductive pattern; and
   (c-1-2) combining said image representing said first region with said enlarged first type hole image through a logical operation to determine said first and second areas.

4. The method of claim 3, wherein
   the step (b) comprises the steps of:
   (b-1) detecting respective diameters of said plurality of through holes; and
   (b-2) comparing said respective diameters of said plurality of through holes with a predetermined threshold value to obtain said first and second type through holes.

5. A method of inspecting a printed board comprising an insulating board having a surface on which a conductive pattern is formed and through which a plurality of through holes extend, wherein said plurality of through holes includes a first type through hole having a first diameter and a second type through hole having a second diameter larger than said first diameter, said method comprising the steps of:
   (a) obtaining an image of said conductive pattern and images of said plurality of through holes, wherein said image of said conductive image has hole parts corresponding to said plurality of through holes;

(b) classifying said images of said plurality of through holes into an image of said first type through hole and an image of said second type through hole;

(c) filling said hole parts of said image of said conductive pattern with said image of said first type through hole and said image of said second type through hole image to obtain a corrected pattern image having no holes therein;

(d) identifying a positional relation between said image of said first type through hole and said corrected pattern image on said surface of said printed board to obtain a first area of said corrected pattern image overlapping said image of said first type through hole and a second area of said corrected pattern image not overlapping said first type through hole; and (e) inspecting said first area in a first inspection mode and inspecting said second area in a second inspection mode different from said first inspection mode.

6. The method of claim 5, wherein
the step (c) comprises the steps of:
(c-1) enlarging said first type hole image and said second type hole image to obtain a corrected first type hole image and a corrected second type hole image, respectively; and
(c-2) filling said hole parts of said image of said conductive pattern with said corrected first and second hole images.

7. The method of claim 6, wherein
the step (d) comprises the steps of:
(d-1) further enlarging said corrected first type hole image to obtain an enlarged first type hole image; and
(d-2) identifying a positional relation between said image of said enlarged first type through hole and said corrected pattern image on said surface of said printed board to obtain said first area and said second area.

8. The method of claim 7, wherein
the step (d-2) comprises the steps of:
(d-2-1) obtaining an image representing a first region including an edge of said corrected pattern image;
(d-2-2) combining said image representing said first region with said enlarged first type hole image through a logical operation to determine said first and second areas.

9. The method of claim 8, wherein
the step (b) comprises the steps of:
(b-1) detecting respective diameters of said plurality of through holes; and
(b-2) comparing said respective diameters of said plurality of through holes with a predetermined threshold value to obtain said first and second type through holes.

10. The method of claim 9, wherein
the step (b-1) comprises the step of:
(b-1-1) applying a spatial operator having a plurality of arms to each of said plurality of said hole images to determine said respective diameters of said plurality of through holes.

11. The method of claim 10, wherein
said first inspection mode is such that inspection of said first area is inhibited; and
said second inspection mode is such that said second area is inspected according to a predetermined inspection procedure.

12. The method of claim 10, wherein
said first inspection mode is such that said first area is inspected in relatively loose inspection condition; and
said second inspection mode is such that said second area is inspected in relatively strict inspection condition.

13. The method of claim 10, wherein
said first inspection mode is such that said first area is inspected for a first inspection item; and
said second inspection mode is such that said second area is inspected for a second inspection item.

14. A device for inspecting a printed board comprising an insulating board having a surface on which a conductive pattern is formed and through which a plurality of through holes extend, wherein said plurality of through holes includes a first type through hole having a first diameter and a second type through hole having a second diameter larger than said first diameter, said device comprising:

(a) means for obtaining images of said plurality of through holes;
(b) means for developing an image of said first type through hole from said images of said plurality of through holes;
(c) means for identifying a location of said image of said first type through hole on said surface of said printed board to obtain a first area of said surface in which said image of said first type through hole is located and a second area of said surface in which said first type through hole is not located; and
(d) means for inspecting said first area in a first inspection mode and inspecting said second area in a second inspection mode different from said first inspection mode.

15. The device of claim 14, wherein
the means (c) comprises:
(c-1) means for enlarging said image of said first type through hole to obtain an enlarged first type hole image; and
(c-2) means for obtaining a location of said enlarged first type hole image on said surface to determine said first and second areas.

16. The device of claim 15, wherein
the means (c-1) comprises:
(c-1-1) means for obtaining an image representing a first region including an edge of said conductive pattern; and
(c-1-2) means for combining said image representing said first region with said enlarged first type hole image through a logical operation to determine said first and second areas.

17. The device of claim 16, wherein
the means (b) comprises:
(b-1) means for detecting respective diameters of said plurality of through holes; and
(b-2) means for comprising said respective diameters of said plurality of through holes with a predetermined threshole value to obtain said first and second type through holes.

18. A device for inspecting a printed board comprising an insulating board having a surface on which a conductive pattern is formed and through which a plurality of through holes extend, wherein said plurality of through holes includes a first type through hole having a first diameter and a second type through hole having a second diameter larger than said first diameter, said device comprising:

(a) means for obtaining an image of said conductive pattern and images of said plurality of through holes, wherein said image of said conductive image has hole parts corresponding to said plurality through holes;

(b) means for classifying said images of said plurality of through holes into an image of said first type through hole and an image of said second type through hole;

(c) means for filling said hole parts of said image of said conductive pattern with said image of said first type through hole and said image of said second type through hole image to obtain a corrected pattern image having no holes therein;

(d) means for identifying a positional relation between said image of said first type through hole and said corrected pattern image on said surface of said printed board to obtain a first area of said corrected pattern image overlapping with said image of said first type through hole and a second area of said corrected pattern image not overlapping with said first type through hole; and (e) means for inspecting said first area in a first inspection mode and inspecting said second area in a second inspection mode different from said first inspection mode.

19. The device of claim 18, wherein the means (c) comprises:

(c-1) means for enlarging said first type hole image and said second type hole image to obtain a corrected first type hole image and a corrected second type hole image, respectively; and (c-2) means for filling said hole parts of said image of said conductive pattern with said corrected first and second hole images.

20. The device of claim 19, wherein the means (d) comprises:

(d-1) means for further enlarging said corrected first type hole image to obtain an enlarged first type hole image; and (d-2) means for identifying a positional relation between said image of said enlarged first type through hole and said corrected pattern image on said surface of said printed board to obtain said first area and said second area.

21. The device of claim 20, wherein the means (d-2) comprises:

(d-2-1) means for obtaining an image representing a first region including an edge of said corrected pattern image; and (d-2-2) means for combining said image representing said first region with said enlarged first type hole image through a logical operation to determine said first and second areas.

22. The device of claim 21, wherein the means (b) comprises:

(b-1) means for detecting respective diameters of said plurality of through holes; and (b-2) means for comprising said respective diameters of said plurality of through holes with a predetermined threshold value to obtain said first and second type through holes.

23. The device of claim 22, wherein the means (b-1) comprises:

(b-1-1) means for applying a spatial operator having a plurality of arms to each of said plurality of said hole images to determine said respective diameters of said plurality of through holes.

24. The device of claim 23, wherein said first inspection mode is such that inspection of said first area is inhibited; and said second inspection mode is such that said second area is inspected according to a predetermined inspection procedure.

25. The device of claim 23, wherein said first inspection mode is such that said first area is inspected in relatively loose inspection condition; and said second inspection mode is such that said second area is inspected in relatively strict inspection condition.

26. The device of claim 23, wherein said first inspection mode is such that said first area is inspected for a first inspection item; and said second inspection mode is such that said second area is inspected for a second inspection item.

* * * * *